United States Patent
Kobayashi

(10) Patent No.: US 7,995,046 B2
(45) Date of Patent: Aug. 9, 2011

(54) DISPLAY DRIVING APPARATUS

(75) Inventor: Hideto Kobayashi, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 902 days.

(21) Appl. No.: 11/896,159

(22) Filed: Aug. 30, 2007

(65) Prior Publication Data

US 2008/0068369 A1    Mar. 20, 2008

(30) Foreign Application Priority Data

Sep. 15, 2006   (JP) ................................. 2006-250289

(51) Int. Cl.
   *G09G 5/00*    (2006.01)
(52) U.S. Cl. ........... 345/204; 345/211; 345/212; 361/56
(58) Field of Classification Search .................. 345/204, 345/212; 361/56
   See application file for complete search history.

(56) References Cited

U.S. PATENT DOCUMENTS

| | | | | |
|---|---|---|---|---|
| 4,649,297 A | * | 3/1987 | Vazehgoo | 326/56 |
| 5,946,177 A | * | 8/1999 | Miller et al. | 361/56 |
| 6,348,831 B1 | * | 2/2002 | Baba | 327/537 |
| 2005/0035960 A1 | | 2/2005 | Kobayashi | |
| 2007/0109698 A1 | * | 5/2007 | Kim | 361/56 |
| 2008/0205100 A1 | * | 8/2008 | Sakamoto | 363/67 |

FOREIGN PATENT DOCUMENTS

JP    2005-176298    6/2005

* cited by examiner

*Primary Examiner* — Amare Mengistu
*Assistant Examiner* — Premal Patel
(74) *Attorney, Agent, or Firm* — Manabu Kanesaka

(57) ABSTRACT

A display driving device outputting a driving signal to a display includes a high-voltage power supply terminal, an output terminal, a high-side output transistor connected between the high-voltage power supply terminal and the output terminal, a reference power supply terminal, a low-side output transistor connected between the output terminal and the reference power supply terminal, a buffer circuit including two MOS transistors connected in series, and a discharge element discharging charge stored in a gate of the low-side output transistor, wherein the gate of the low-side output transistor is connected to a connecting point of the two MOS transistors and the discharge element. Thus, even if electrostatic discharge is repeatedly applied to the output terminal by a positive charge as against the ground potential in the display driving apparatus, the low-side output transistor can be prevented from being damaged without charge stored in the gate of the low-side output transistor.

11 Claims, 5 Drawing Sheets

DISPLAY DRIVING APPARATUS

BACKGROUND OF THE INVENTION AND RELATED ART STATEMENT

The invention relates to a display driving apparatus outputting a driving signal to a display, and in particular relates to a display driving apparatus for driving a plasma display panel.

In recent years, display apparatuses such as television receivers and so on tend to be large in size and thin, and also plasma display panels (hereinafter referred to as PDPs) are used widely. As a driving apparatus for driving the PDP, the driving apparatus using a MOS transistor in an output stage is proposed (see, for example, paragraph numbers [0001]~[0010] and [0026]~[0039], and FIGS. 1 to 3 and FIG. 9 in Japanese Patent Application Publication No. 2005-176298, which corresponds to United States Patent Application Publication No. US2005/0036950A1 and Korean Patent Application Publication No. 2005/014672). FIG. 3 is a view schematically showing an example of the constitution of a PDP driving apparatus.

The PDP driving apparatus shown in FIG. 3 has a plurality of scan drivers SD1 to SDn and data (address) drivers DD1 to DDm for driving a two-electrode PDP (here, n and m are positive integers). The scan drivers SD1 to SDn respectively drive a plurality of scanning (sustaining) electrodes, and the data drivers DD1 to DDm respectively drive a plurality of data electrodes corresponding to each color of R (red), G (green) and B (blue). These scanning electrodes and data electrodes are arranged in a grid so as to be perpendicular to one another, and discharge cells, not shown, are disposed at the points of intersection therebetween.

In the PDP driving apparatus of the configuration, data from the data electrodes are written into the discharge cells while scanning through every scanning electrode by the scan drivers SD1 to SDn and the data drivers DD1 to DDm, and discharge sustaining pulses are output to the scanning electrodes to sustain the discharges for a predetermined period, whereby an image is displayed.

FIG. 4 is a view showing the circuit configuration of an output stage in a conventional display driving apparatus for driving one scan line in the scan drivers SD1 to SDn. The display driving apparatus has two n-channel type IGBTs (Insulated Gate Bipolar Transistors) Q101 and Q102 which are connected in series. The IGBT Q101 which is a high-side output element is driven by a level shifter circuit 101, and the IGBT Q102 which is a low-side output element is driven by a buffer circuit which consists of an inverter IC 101 and a totem-pole circuit of two n-channel type MOS transistors NT101 and NT102 connected in series. In addition, a connecting point of the two IGBTs Q101 and Q102 is connected to an output terminal $T_O$.

A high-side diode D101 and a low-side diode D102 are connected to the IGBT Q101 and the IGBT Q102 in parallel respectively. Moreover, a resistor R101 and a Zener diode ZD101 are connected to a gate of the IGBT Q101, and a Zener diode ZD102 is connected to a gate of the IGBT Q102.

In a circuit shown in FIG. 4, the IGBT Q101 is controlled by a signal of a high voltage VDH so that a signal of a low voltage VDL of 0 to 5 volts is converted into the signal of the high voltage VDH of 0 to 100 volts by a level shifter circuit 101, and the IGBT Q102 is controlled by the buffer circuit constituted from the totem-pole circuit of the MOS transistors NT101 and NT102.

The reason why the buffer circuit controlling the IGBT Q102 is constituted from the totem-pole circuit of the MOS transistors NT101 and NT102 is to make a drop in an output waveform gradual during the address discharge and to prevent the output voltage of the IGBT Q102 from becoming high by making the gate voltage of the IGBT Q102 higher than the low voltage power supply VDL through a parasitic capacitance C101 and increasing the drive capability of the IGBT Q102 when the output voltage of the IGBT Q102 became high in operation. At this time, the gate voltage of the IGBT Q102 is clamped at about 7 volts due to a Zener diode ZD102.

Furthermore, a driving signal of a high voltage of 100 volts is output from the above circuit to the scanning electrodes and the discharge cells of the PDP, but it is necessary to reduce the potential of the output terminal To to 0 volt by turning the IGBT Q102 on at the time of the address discharge. To do this, a signal of an input terminal Ti is made to be L (low level) and the output of the buffer circuit is made to be H (high level), and the IGBT Q102 is turned on. As a result, 0 volt, i.e. the same potential as the reference power supply potential GND is output to the output terminal To. About 3 volts, which is lower than the low voltage VDL, is applied to the gate of the IGBT Q102 at this time. The reason for this will be explained as follows with reference to FIG. 5.

FIG. 5 is a cross-sectional view schematically showing the structure of the MOS transistor NT101 in the buffer circuit. The MOS transistor NT101 comprises a p well 11 formed on a substrate 10, a drain electrode 12 and a source electrode 13 which are formed by implanting the impurity of an n+ type into the surface of the p well 11, a gate oxide film 14 and a gate electrode 15 formed on the gate oxide film 14.

When 5 volts is applied to the gate electrode 15 in the MOS transistor NT101, the MOS transistor NT101 becomes an on-state due to a channel formed. In this configuration, the MOS transistor NT101 functions as a source follower circuit and approximately the voltage applied to the gate electrode being subtracted from the threshold voltage of the MOS transistor NT101 is output from the source electrode 13. The p well 11 is 0 volt at this time, and the threshold voltage is increased by a back gate effect (a substrate effect). When 5 volts is applied to the drain electrode 12 by the low voltage VDL, the potential of source electrode 13 becomes about 3 volts. Because the source electrode 13 is connected to the gate of the IGBT Q102, about 3 volts lower than the low voltage VDL is supplied to the gate of the IGBT Q102.

FIG. 6 is a timing diagram showing part of current and voltage wave forms during the address discharge, and shows the wave forms of the gate voltage of the MOS transistor NT102, the gate voltages of IGBT Q101 and IGBT Q102 and the output voltage Vo (the potential of the output terminal To) respectively.

When changing an input voltage to L level at time t1, a gate voltage of the IGBT Q101 drops from the high voltage VDH to the ground potential GND and also the gate voltage of the MOS transistor NT102 in the buffer circuit drops to the ground potential GND, so the gate voltage of the IGBT Q102 rises to a voltage of about 3 volts, which is lower than the low voltage VDL, and the IGBT Q102 becomes the on-state after turning on. When the IGBT Q102 turns on in this way, the wave form in a drop of the output voltage Vo is more gentle than that in the case that the gate voltage of the IGBT Q102 is the low voltage VDL, and the potential of the output voltage Vo becomes 0 volt at time t2. At this time, a current Ip due to charge stored in the discharge cell of the PDP connected to the output terminal To does not flow rapidly and flows to the ground terminal connected to an emitter of the IGBT Q102 in accordance with the period up to the time t2. After the output voltage Vo becomes 0 volt, once the effective voltage due to a high voltage applied to the data electrodes of the PDP at time t3 has become sufficiently high, a plasma discharge is started, and hence a discharge current Ih flows. The discharge current Ih finishes flowing at time t4.

In the course of operation, because the discharge current Ih rapidly flows through a collector of the IGBT Q102 at the time of the address discharge, the gate voltage of the IGBT Q102 rises due to the drain-gate capacitance, i.e. the parasitic capacitance C101 of the IGBT Q102, and the output voltage Vo is raised accordingly. The gate of the IGBT Q102 rises to about 5 volts which is approximately the same as the low voltage VDL hereby and large current flows instantaneously. This makes a stable display.

In this way, without suppressing the discharge current, a drop in the output waveform during the address discharge can be made gentle, whereby noise can be prevented. Moreover, because current supply capacity is suppressed, the element can be prevented from being damaged due to an excessive current upon a short-circuiting of an output. However, when, for example, in the conventional display driving apparatus configured as above, ESD (electrostatic discharge) is applied to the output terminal by a positive charge as against the ground potential in an outgoing test or an acceptance test, the positive charge usually flows to a power line of the high voltage through the high-side diode. But when ESD is repeatedly applied to the output terminal, the low-side IGBT is turned on at the time of ESD applied because the charge is stored in the gate of the low-side IGBT. Because of this, as shown in a dotted line with an arrow of FIG. 4, there has been a problem that the charge of ESD flows through only the low-side IGBT and this makes the element prone to damage.

In view of such a problem, it is an object of the invention to provide a display driving apparatus wherein the low-side output transistor can be prevented from being damaged without charge stored in the gate of the low-side output transistor even if ESD is repeatedly applied to the output terminal by the positive charge as against the ground potential.

Further objects and advantages of the invention will be apparent from the following description of the invention.

SUMMARY OF THE INVENTION

To attain the above object, according to a first aspect of the invention, a display driving apparatus outputting a driving signal to a display includes a high-voltage power supply terminal, an output terminal, a high-side output transistor connected between the high-voltage power supply terminal and the output terminal, a reference power supply terminal, a low-side output transistor connected between the output terminal and the reference power supply terminal, a buffer circuit including two MOS transistors connected in series, and a discharge element discharging charge stored in a gate of the low-side output transistor, wherein the gate of the low-side output transistor is connected to a connecting point of the two MOS transistors and the discharge element.

Because, according to the present invention, the charge of the gate of the low-side output transistor is pulled out with the discharge element, the low-side output transistor can be prevented from being damaged without charge stored in the gate of the low-side output transistor even if ESD is repeatedly applied to the output terminal by the positive charge as against the ground potential.

The display driving apparatus according to the invention is advantageous in that because the charge of the gate of the low-side output transistor is pulled out with a discharge element, the low-side output transistor can be prevented from being damaged without charge stored in the gate of the low-side output transistor even if ESD is repeatedly applied to the output terminal by the positive charge as against the ground potential.

DETAILED DESCRIPTION OF PREFERRED EMBODIMENTS

Figure 1:
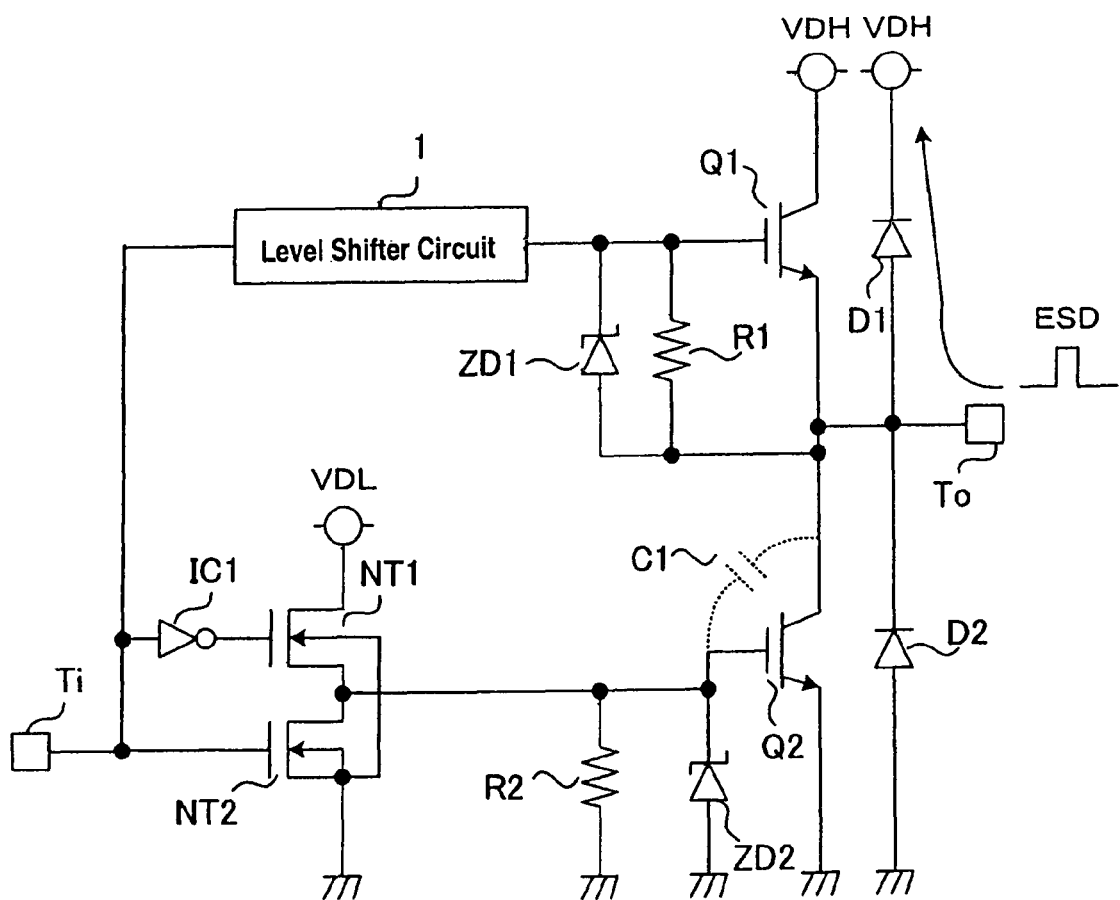
FIG. 1 is a view showing the circuit configuration of a display driving apparatus according to a first embodiment of the invention.
Figure 3:
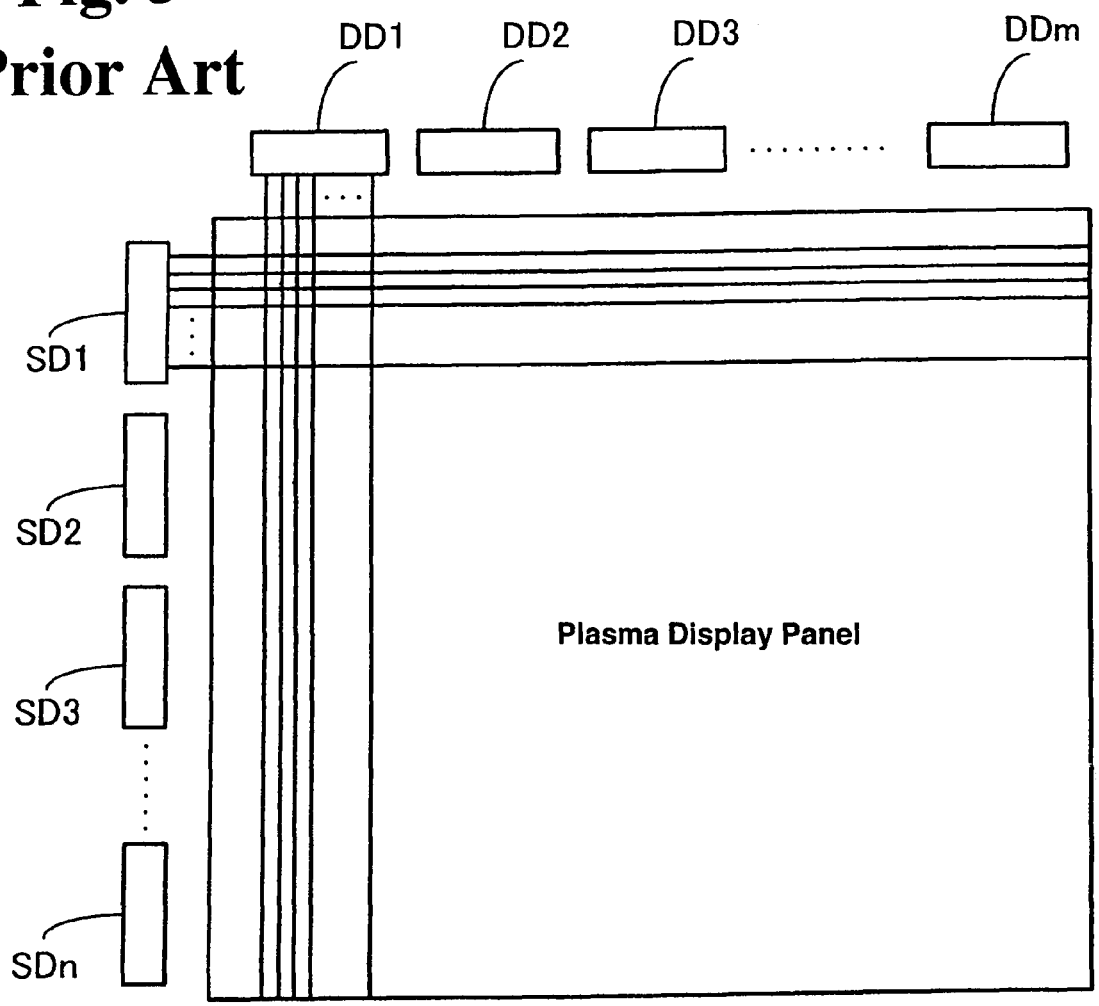
FIG. 3 is a view showing schematically an example of the constitution of a PDP driving apparatus.
Figure 4:
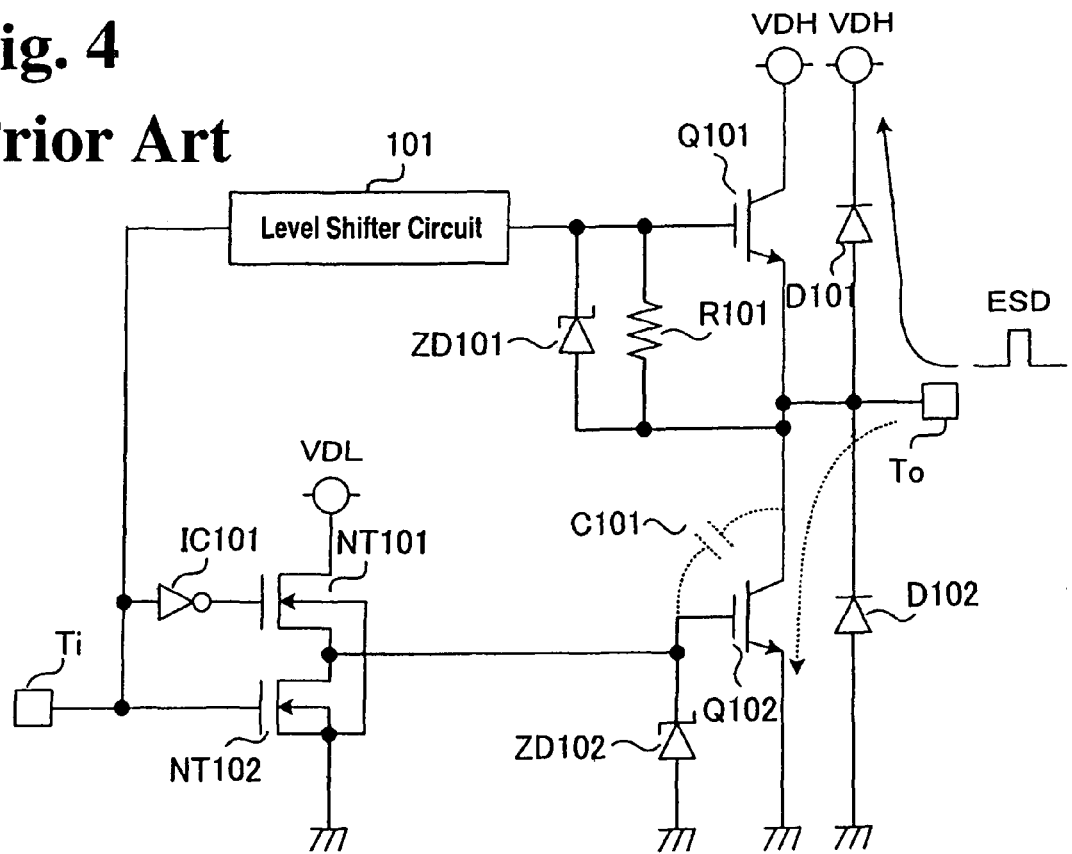
FIG. 4 is a view showing the circuit configuration of a conventional display driving apparatus.
Figure 5:
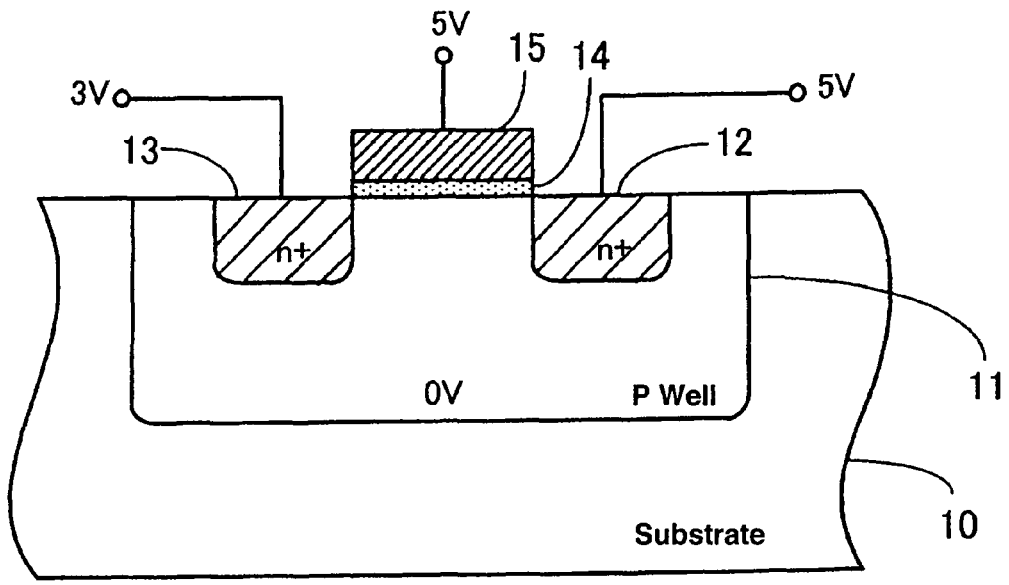
FIG. 5 is a cross-sectional view showing schematically the structure of a MOS transistor in a buffer circuit.
Figure 6:
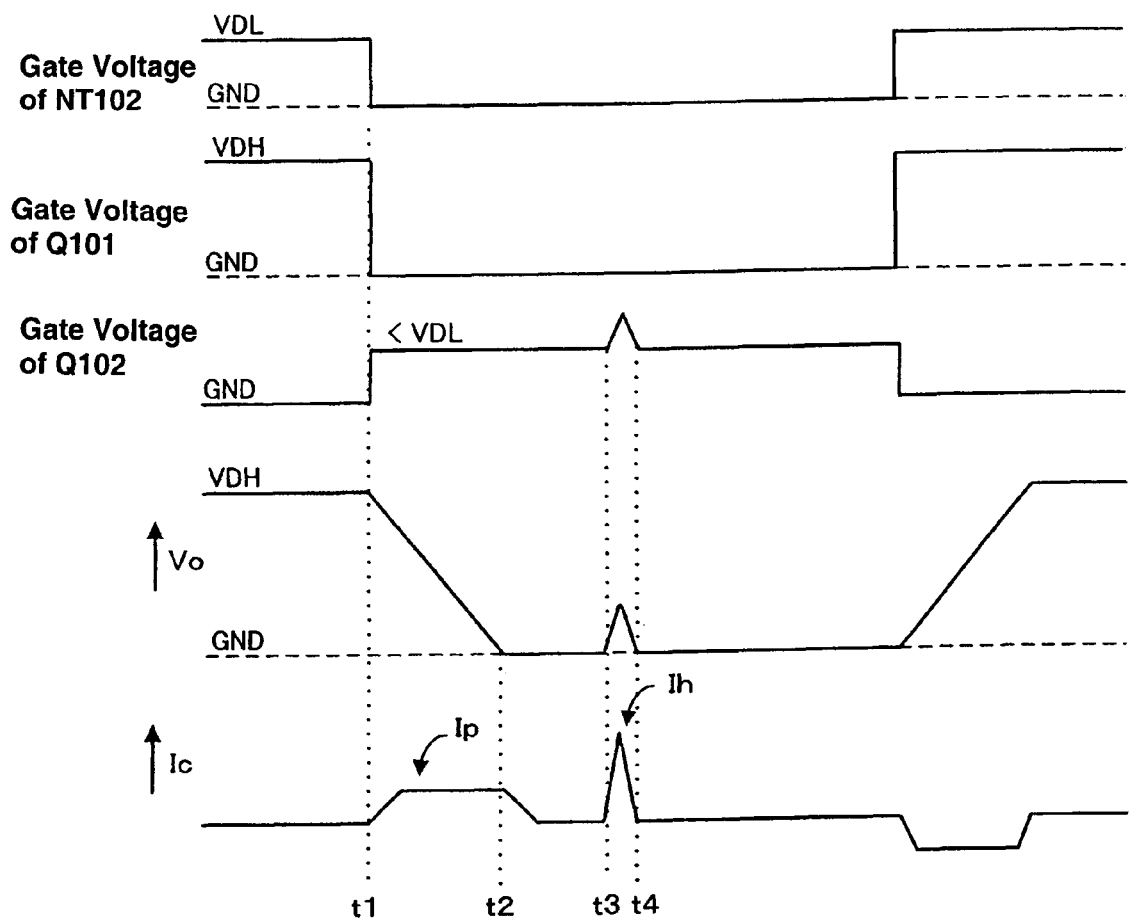
FIG. 6 is a timing diagram showing part of voltage and current wave forms during an address discharge.

Preferred embodiments according to the invention will be described with reference to the accompanying drawings. FIG. 1 is a view showing the circuit configuration of a display driving apparatus according to the first embodiment of the invention. The display driving apparatus outputs a driving signal to a PDP of a display shown in FIG. 3, and includes an IGBT Q1 which is a high-side output transistor connected between an output terminal To and a high-voltage power supply terminal to which a high voltage VDH is supplied and an IGBT Q2 which is a low-side output transistor connected between the output terminal To and a reference power supply terminal of a ground potential GND. The IGBT Q1 and the IGBT Q2 are connected to a high-side diode D1 and a low-side diode D2 in parallel, respectively.

A gate of the IGBT Q1 is connected to a second end of a resistor R1, in which a first end is connected to a connecting point of the IGBT Q1 and the IGBT Q2, and a cathode of a Zener diode ZD1, in which an anode is connected to the connecting point of the IGBT Q1 and the IGBT Q2. A gate of the IGBT Q2 is connected to a connecting point of two series-connected n-channel type MOS transistors NT1 and NT2 constituting a buffer circuit along with an inverter IC 1, a cathode of a Zener diode ZD2, in which an anode is connected to the reference power supply terminal, and further a second end of a resistor R2, in which a first end is connected to the reference power supply terminal as a discharge element discharging charge stored in the gate of the IGBT Q2.

In a circuit shown in FIG. 1, a signal of a low voltage VDL of 0 to 5 volts is converted into a signal of a high voltage VDH of 0 to 100 volts by a level shifter circuit 1, and the converted signal controls IGBT Q1. The buffer circuit constituted from a totem pole circuit of the MOS transistors NT1 and NT2 controls the IGBT Q2.

The gate of the IGBT Q1 is connected to the Zener diode ZD1 to protect the gate of the IGBT Q1, so that a gate voltage of the IGBT Q1 is clamped at a constant voltage. The gate of the IGBT Q2 is also connected to the Zener diode ZD2 to protect the gate of the IGBT Q2, so that a gate voltage of the IGBT Q2 is clamped at a constant voltage (about 7 volts). Further the gate of the IGBT Q2 is connected to the second end of the resistor R2 in which the first end is at the ground potential GND. Because of this, even if ESD above-described is repeatedly applied to the output terminal To by the positive charge as against the ground potential GND, the charge of gate of the IGBT Q2 is pulled out through the resistor R2. In other words, the positive charge is made not to be stored in the gate of the IGBT Q2 so that the IGBT Q2 is in an off-state at the time of ESD applied, and whereby the positive charge can flow through the high-side diode D1 as shown in a solid line with an arrow of FIG. 1 without current due to ESD flowing through the IGBT Q2. Thus, a low-side element can be prevented from being damaged and ESD withstand-capability for the output circuit can be increased.

Figure 2:
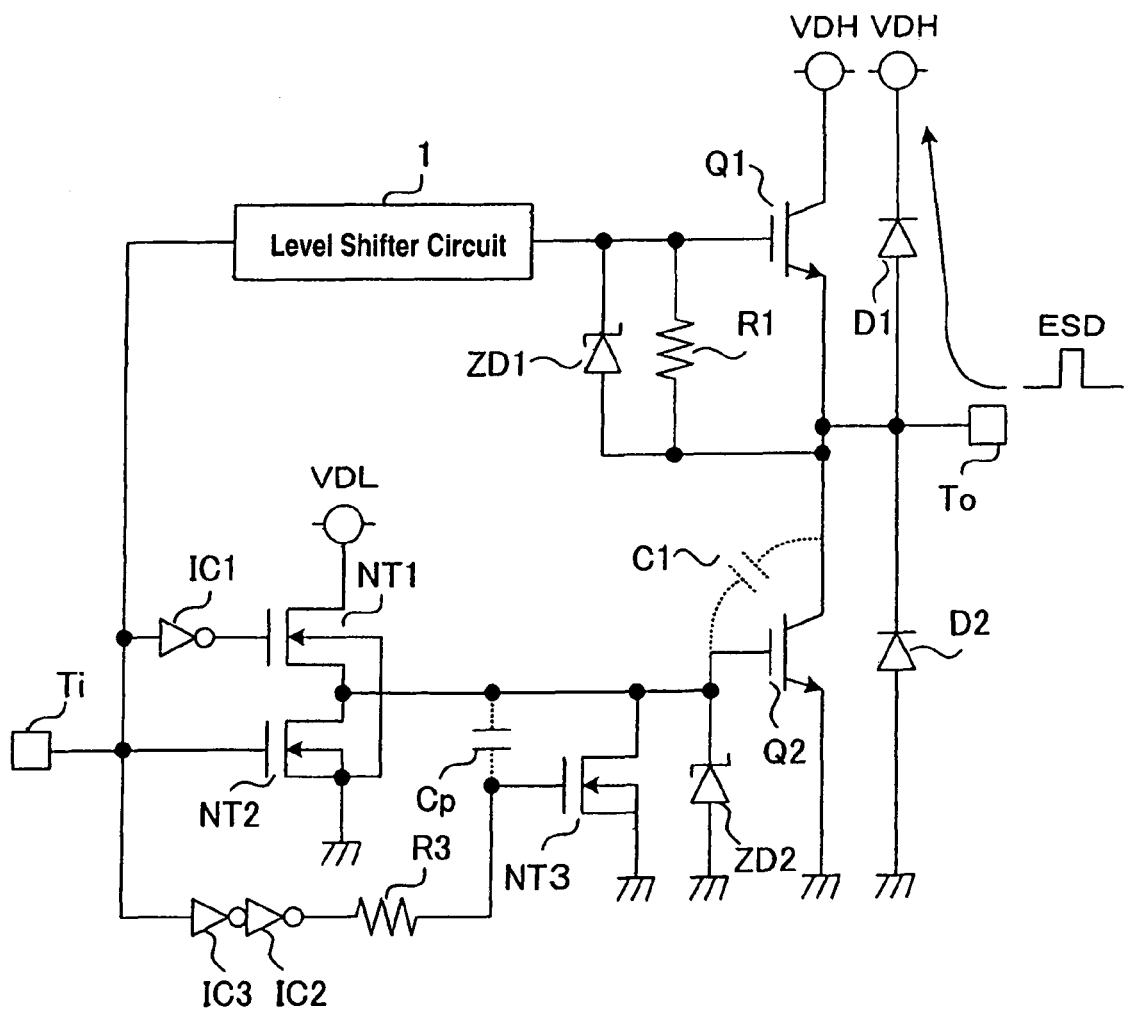
FIG. 2 is a view showing the circuit configuration of a display driving apparatus according to a second embodiment of the invention.

FIG. 2 is a view showing the circuit configuration of a display driving apparatus according to a second embodiment of the invention, and the same symbols as in FIG. 1 respectively represent the same elements. In the second embodiment, the gate of the IGBT Q2 is connected to the connecting point of the series circuit of the MOS transistors NT1 and NT2, the cathode of the Zener diode ZD2, in which the anode is connected to the reference power supply terminal, and further a drain of an n-channel type MOSFET NT3, in which a source is connected to the reference power supply terminal, as the discharge element discharging charge stored in the gate of the ITGBT Q2. Moreover, a resistor R3 is connected between a gate of the MOS transistor NT3 and a control element controlling the gate of MOS transistor NT3. The control element comprises inverters IC2 and IC3 here. Configuration except these is the same as FIG. 1.

In a circuit shown in FIG. 2, the signal of the low voltage VDL of 0 to 5 volts is converted into the signal of the high voltage VDH of 0 to 100 volts by the level shifter circuit 1, and the converted signal controls IGBT Q1. The buffer circuit constituted from the totem pole circuit of the MOS transistors NT1 and NT2 controls the IGBT Q2. The gate of the IGBT Q2 is also connected to the Zener diode ZD2 to protect the gate of the IGBT Q2, and therefore the gate voltage of the IGBT Q2 is clamped at the constant voltage (about 7 volts).

Moreover, the gate of the IGBT Q2 is connected to a drain of an n-channel type MOSFET NT3 in which a source is connected to the reference power supply terminal. Because of this, even if ESD is repeatedly applied to the output terminal To by the positive charge as against the ground potential GND, the charge of the gate of the IGBT Q2 is pulled out through the MOS transistor NT3. The size (in other words, a gate capacitance) of the MOS transistor NT3 is made smaller than the standard size of the MOS transistors NT1 and NT2 constituting the buffer circuit so that the MOS transistor NT3 is turned on by the action of a parasitic capacitance Cp when the gate voltage of IGBT Q2 rises at the time of ESD applied. In addition, the resistor R3 is interposed between the gate of MOS transistor NT3 and the output side of a control element controlling the gate voltage of the MOS transistor NT3. The resistor R3 is a limiting resistor not to allow the charge of a gate capacitance of the MOS transistor NT3 to discharge instantaneously. The IGBT Q2 is made the off-state at the time of ESD applied because the MOS transistor NT3 turns on, and charge due to ESD can always flow through the high-side diode D1 as shown in a solid line with an arrow of FIG. 2. Thus, the low-side element can be prevented from being damaged and ESD withstand-capability of the output circuit can be increased.

In addition, the parasitic capacitance Cp is configured with a capacitance between the drain and the gate of the MOS transistor NT3, but a normal capacitance (capacitor) may be provided between the drain and the gate of the MOS transistor NT3 to make the operation certainly.

The disclosure as disclosed in Japanese patent Application No. 2006-250289 filed on Sep. 15, 2006 is incorporated herein.

While the invention has been explained with reference to the specific embodiments of the invention, the explanation is illustrative, and the invention is limited only by appended claims.

What is claimed is:

1. A display driving apparatus outputting a driving signal to a display comprising:
   a high-voltage power supply terminal;
   an output terminal;
   a high-side output transistor connected between the high-voltage power supply terminal and the output terminal;
   a reference power supply terminal;
   a low-side output transistor connected between the output terminal and the reference power supply terminal, and having a gate;
   a buffer circuit including two MOS transistors connected in series; and
   a discharge element discharging charge stored in the gate of the low-side output transistor, the discharge element being configured to discharge the charge stored in the gate of the low-side output transistor irrespective of the on/off states of the two MOS transistors;
   wherein the gate of the low-side output transistor is connected to a connecting point of the two MOS transistors and the discharge element.

2. The display driving apparatus according to claim 1, wherein the discharge element is a resistor having a first end connected to the reference power supply terminal and a second end connected to the gate of the low-side output transistor.

3. The display driving apparatus according to claim 1, wherein the discharge element is an n-channel MOS transistor having a source connected to the reference power supply terminal and a drain connected to the gate of the low-side output transistor.

4. The display driving apparatus according to claim 3, further comprising a capacitor connected between a gate and the drain of the n-channel MOS transistor.

5. The display driving apparatus according to claim 3, further comprising a resistor connected between a gate of the n-channel MOS transistor and a control element controlling the gate of the n-channel MOS transistor.

6. The display driving apparatus according to claim 5, wherein the control element comprises serially connected inverters.

7. The display driving apparatus according to claim 6, wherein the serially connected inverters are connected between the resistor and an input terminal.

8. The display driving apparatus according to claim 7, wherein the input terminal is connected with a first of the gates of the two MOS transistors of the buffer circuit and with a second of the gates of the two MOS transistors via an inverter circuit.

9. The display driving apparatus according to claim 1, further comprising a Zener diode having an anode connected to the reference power supply terminal and a cathode connected to the gate of the low-side output transistor.

10. The display driving apparatus according to claim 1, wherein the high-side output transistor and the low-side output transistor are Insulated Gate Bipolar Transistors.

11. The display driving apparatus according to claim 1, wherein the discharge element is different from the buffer circuit, and gradually discharges the charge stored in the gate of the low-side output transistor.

* * * * *